(12) United States Patent  
Chintarlapalli Reddy et al.

(10) Patent No.: US 9,397,101 B2  
(45) Date of Patent: Jul. 19, 2016

(54) STACKED COMMON GATE FINFET DEVICES FOR AREA OPTIMIZATION

(71) Applicant: QUALCOMM Incorporated, San Diego, CA (US)

(72) Inventors: HariKrishna Chintarlapalli Reddy, Bangalore (IN); Jay Madhukar Shah, Bangalore (IN); Ananth Haliyur Gopalakrishna, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 226 days.

(21) Appl. No.: 14/458,228

(22) Filed: Aug. 12, 2014

(65) Prior Publication Data

US 2015/0255461 A1    Sep. 10, 2015

Related U.S. Application Data

(60) Provisional application No. 61/949,025, filed on Mar. 6, 2014.

(51) Int. Cl.
| | |
|---|---|
| *H01L 27/118* | (2006.01) |
| *H01L 27/092* | (2006.01) |
| *H01L 27/088* | (2006.01) |
| *H01L 27/02* | (2006.01) |

(52) U.S. Cl.  
CPC ........ *H01L 27/0924* (2013.01); *H01L 27/0207* (2013.01); *H01L 27/0886* (2013.01)

(58) Field of Classification Search  
CPC ............ H01L 27/0924; H01L 27/0207; H01L 27/0886

USPC .......................................................... 257/204  
See application file for complete search history.

(56) References Cited

U.S. PATENT DOCUMENTS

| | | | | |
|---|---|---|---|---|
| 7,279,375 | B2* | 10/2007 | Radosavljevic | ... H01L 29/41791 257/E21.444 |
| 7,871,876 | B2* | 1/2011 | Anderson | ....... H01L 21/823807 257/351 |
| 8,659,072 | B2 | 2/2014 | Ou et al. | |
| 2008/0283925 | A1* | 11/2008 | Berthold | ............. H01L 27/1211 257/368 |
| 2009/0152589 | A1 | 6/2009 | Rakshit et al. | |
| 2013/0207199 | A1* | 8/2013 | Becker | .................. H01L 27/092 257/369 |
| 2013/0306967 | A1 | 11/2013 | Hoentschel et al. | |
| 2013/0334610 | A1 | 12/2013 | Moroz et al. | |

* cited by examiner

*Primary Examiner* — David Vu  
*Assistant Examiner* — Brandon Fox  
(74) *Attorney, Agent, or Firm* — Arent Fox LLP

(57) ABSTRACT

A MOS device includes a first FinFET having a first transistor source, drain, gate, and set of fins, and includes a second FinFET having a second transistor source, drain, gate, and set of fins. The MOS device further includes a gate interconnect extending linearly to form and to connect together the first and second transistor gates. The MOS device further includes a first interconnect on a first side of the gate interconnect that connects together the set of first transistor fins at the first transistor drain and the set of second transistor fins at the second transistor source, a second interconnect on a second side of the gate interconnect that connects together the set of first transistor fins at the first transistor source, and a third interconnect on the second side of the gate interconnect that connects together the set of second transistor fins at the second transistor drain.

20 Claims, 8 Drawing Sheets

STACKED COMMON GATE FINFET DEVICES FOR AREA OPTIMIZATION

CROSS-REFERENCE TO RELATED APPLICATION(S)

This application claims the benefit of U.S. Provisional Application Ser. No. 61/949,025, entitled "STACKED COMMON GATE FINFET DEVICES FOR AREA OPTIMIZATION" and filed on Mar. 6, 2014, which is expressly incorporated by reference herein in its entirety.

BACKGROUND

1. Field

The present disclosure relates generally to a layout construction, and more particularly, to a structure for stacking common gate fin field-effect transistors (FinFETs) for area optimization.

2. Background

A standard cell is an integrated circuit that may be implemented with digital logic. An application-specific integrated circuit (ASIC), such as a system-on-a-chip (SoC) device, may contain thousands to millions of standard cells. Reducing a size/area footprint of ASICs is beneficial. Accordingly, there is a need for reducing the size/area footprint of individual standard cells.

SUMMARY

In an aspect of the disclosure, a metal oxide semiconductor (MOS) device includes a first FinFET having a first transistor source, a first transistor drain, a first transistor gate, and a set of first transistor fins. The set of first transistor fins extends from the first transistor gate and forms the first transistor source and the first transistor drain. The MOS device further includes a second FinFET having a second transistor source, a second transistor drain, a second transistor gate, and a set of second transistor fins. The set of second transistor fins extends from the second transistor gate and forms the second transistor source and the second transistor drain. The MOS device further includes a first gate interconnect extending linearly to form the first transistor gate and the second transistor gate and to connect together the first transistor gate and the second transistor gate. The first transistor drain and the second transistor source are on a first side of the first gate interconnect. The first transistor source and the second transistor drain are on a second side of the first gate interconnect. The MOS device further includes a first interconnect on the first side of the first gate interconnect that connects together the set of first transistor fins at the first transistor drain and the set of second transistor fins at the second transistor source. The MOS device further includes a second interconnect on the second side of the first gate interconnect that connects together the set of first transistor fins at the first transistor source. The MOS device further includes a third interconnect on the second side of the first gate interconnect that connects together the set of second transistor fins at the second transistor drain. The third interconnect is disconnected from the second interconnect. The MOS device further includes a second gate interconnect extending adjacent one of the first transistor source and the second transistor drain or the first transistor drain and the second transistor source. The set of first transistor fins and the set of second transistor fins extend through the second gate interconnect.

In an aspect of the disclosure, a method of operation of a MOS device is provided. The MOS device is an apparatus that includes first FinFET having a first transistor source, a first transistor drain, a first transistor gate, and a set of first transistor fins. The apparatus further includes a second FinFET having a second transistor source, a second transistor drain, a second transistor gate, and a set of second transistor fins. A current flows from a first interconnect at the first transistor source to a second interconnect at the first transistor drain. The first interconnect connects together the set of first transistor fins. The second interconnect connects together the set of first transistor fins and the set of second transistor fins. The current flows from the first transistor drain to the second transistor source through the second interconnect. The current flows from the second interconnect at the second transistor source to a third interconnect at the second transistor drain. The third interconnect connects together the set of second transistor fins. The third interconnect is disconnected from the first interconnect.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
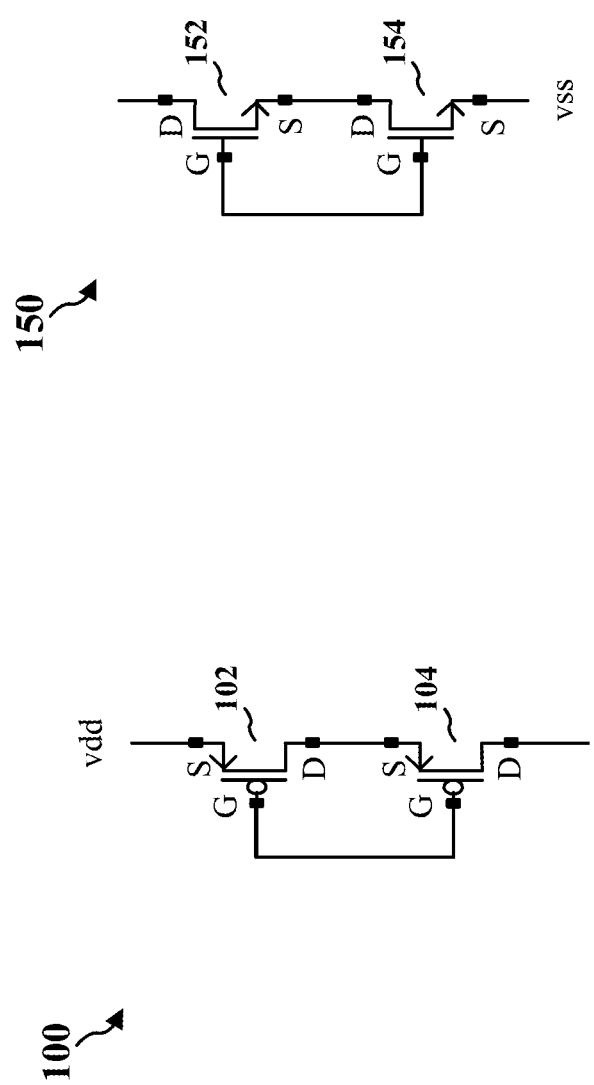
FIGS. 1A and 1B are circuit diagrams of a pair of series connected p-type MOS transistors and a pair of series connected n-type MOS transistors, respectively.

FIGS. 1A and 1B are circuit diagrams of a pair of series connected p-type MOS (pMOS) transistors and a pair of series connected n-type MOS (nMOS) transistors, respectively. As shown in FIG. 1A, the circuit 100 includes a pMOS transistor 102 connected in series with a pMOS transistor 104. The pair of pMOS transistors 102, 104 may be FinFETs. The pair of pMOS transistors 102, 104 may be constructed in a stacked configuration with a shared gate interconnect that forms the gates of the pMOS transistors 102, 104. As shown in FIG. 1B, the circuit 150 includes an nMOS transistor 152 connected in series with an nMOS transistor 154. The pair of nMOS transistors 152, 154 may be FinFETs. The pair of nMOS transistors 152, 154 may be constructed in a stacked configuration with a shared gate interconnect that forms the gates of the nMOS transistors 152, 154. A FinFET may also be referred to as a multiple gate field-effect transistor (FET) (MuGFET), a tri-gate FET, or a multi-gate FET. When two gates of a MuGFET are tied together, such a device may be referred to as a shorted-gate FinFET or tied-gate FinFET.

In one configuration, the pMOS FinFETs 102, 104 and/or the nMOS FinFETs 152, 154 may be constructed by connecting together the fins on one side of the shared gate interconnect and by connecting together two separate sets of fins on the other side of the shared gate interconnect. A layout of a pair of FinFETs with such fin connections in a stacked configuration is illustrated with respect to FIG. 2.

Figure 2:
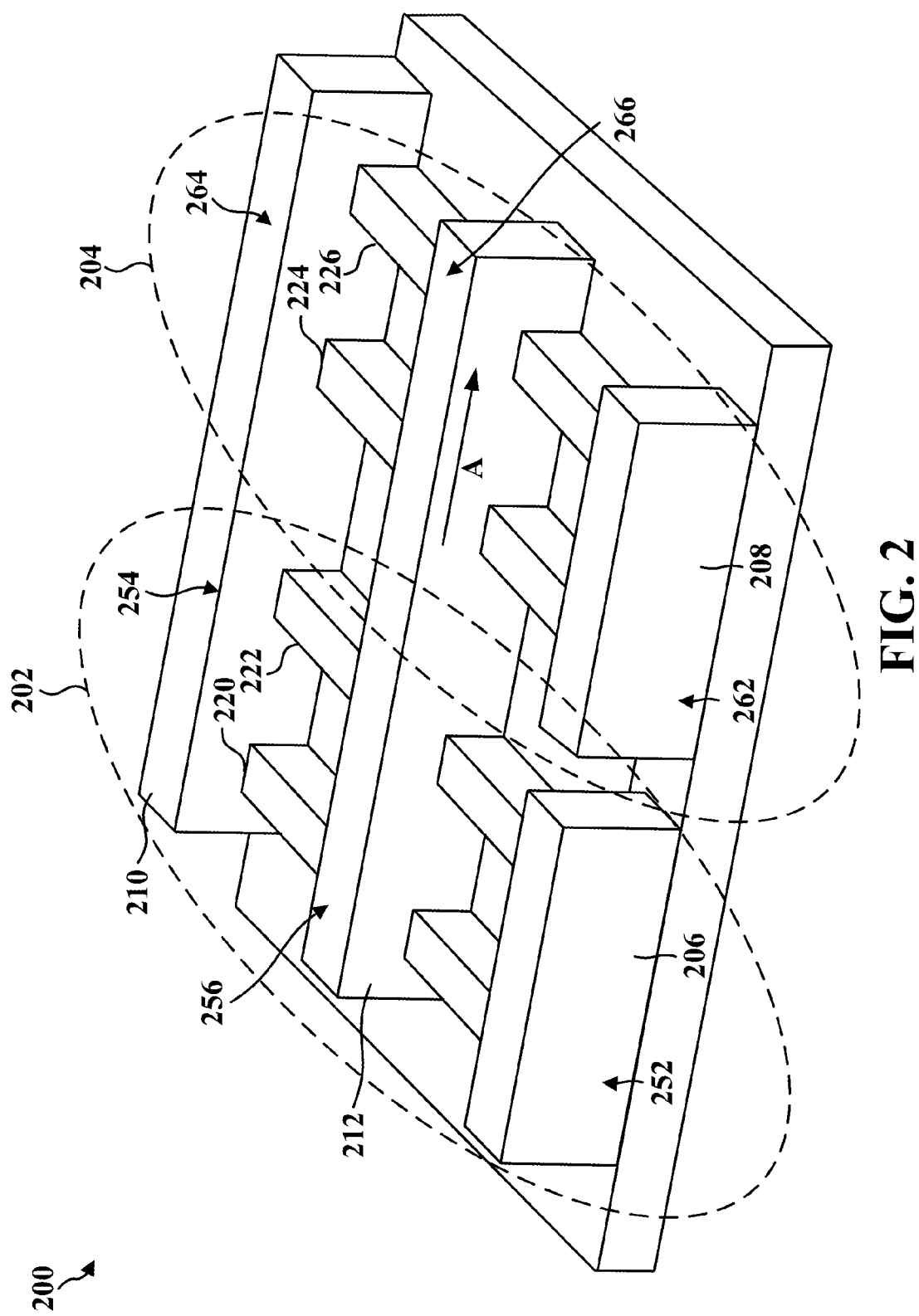
FIG. 2 is a diagram illustrating an exemplary layout of a MOS device.

FIG. 2 is a diagram 200 illustrating an exemplary layout of a MOS device. Referring to FIG. 2, a FinFET device may be split into a pair of FinFETs 202, 204 in a stacked configuration by connecting together the fins 220, 222, 224, 226 on a first side of the shared gate interconnect 212 and by connecting together separately a first set of fins 220, 222 and a second set of fins 224, 226 on the second side of the shared gate interconnect 212. The fins 220, 222, 224, 226 may be connected together on the first side of the shared gate interconnect 212 with the interconnect 210. The fins 220, 222 may be connected together on the second side of the shared gate interconnect 212 with the interconnect 206, and the fins 224, 226 may be connected together on the second side of the shared gate interconnect 212 with the interconnect 208.

The first FinFET 202 has a first transistor source 252, a first transistor drain 254, a first transistor gate 256, and a set of first transistor fins 220, 222. The set of first transistor fins 220, 222 extends from the first transistor gate 256. The set of first transistor fins 220, 222 extend through the first transistor gate 256 such that the first transistor gate 256 surrounds the set of first transistor fins 220, 222 on at least three sides. The set of first transistor fins 220, 222 and the interconnect 206 form the first transistor source 252. The set of first transistor fins 220, 222 and the interconnect 210 form the first transistor drain 254. A second FinFET has a second transistor source 264, a second transistor drain 262, a second transistor gate 266, and a set of second transistor fins 224, 226. The set of second transistor fins 224, 226 extends from the second transistor gate 266. The set of second transistor fins 224, 226 extend through the second transistor gate 266 such that the second transistor gate 266 surrounds the set of second transistor fins 224, 226 on at least three sides. The set of second transistor fins 224, 226 and the interconnect 210 form the second transistor source 264. The set of second transistor fins 224, 226 and the interconnect 208 form the second transistor drain 262.

The gate interconnect 212 extends linearly in direction A to form the first transistor gate 256 and the second transistor gate 266 and to connect together the first transistor gate 256 and the second transistor gate 266. The first transistor drain 254 and the second transistor source 264 are on the first side of the gate interconnect 212. The first transistor source 252 and the second transistor drain 262 are on the second side of the gate interconnect 212. The interconnects 210, 206, 208 may be referred to as first, second, and third interconnects, respectively. The first interconnect 210 on the first side of the gate interconnect 212 connects together the set of first transistor fins 220, 222 at the first transistor drain 254 and the set of second transistor fins 224, 226 at the second transistor source 264. The second interconnect 206 on the second side of the gate interconnect 212 connects together the set of first transistor fins 220, 222 at the first transistor source 252. The third interconnect 208 on the second side of the gate interconnect 212 connects together the set of second transistor fins 224, 226 at the second transistor drain 262. The third interconnect 208 is disconnected from the second interconnect 206.

Figure 3:
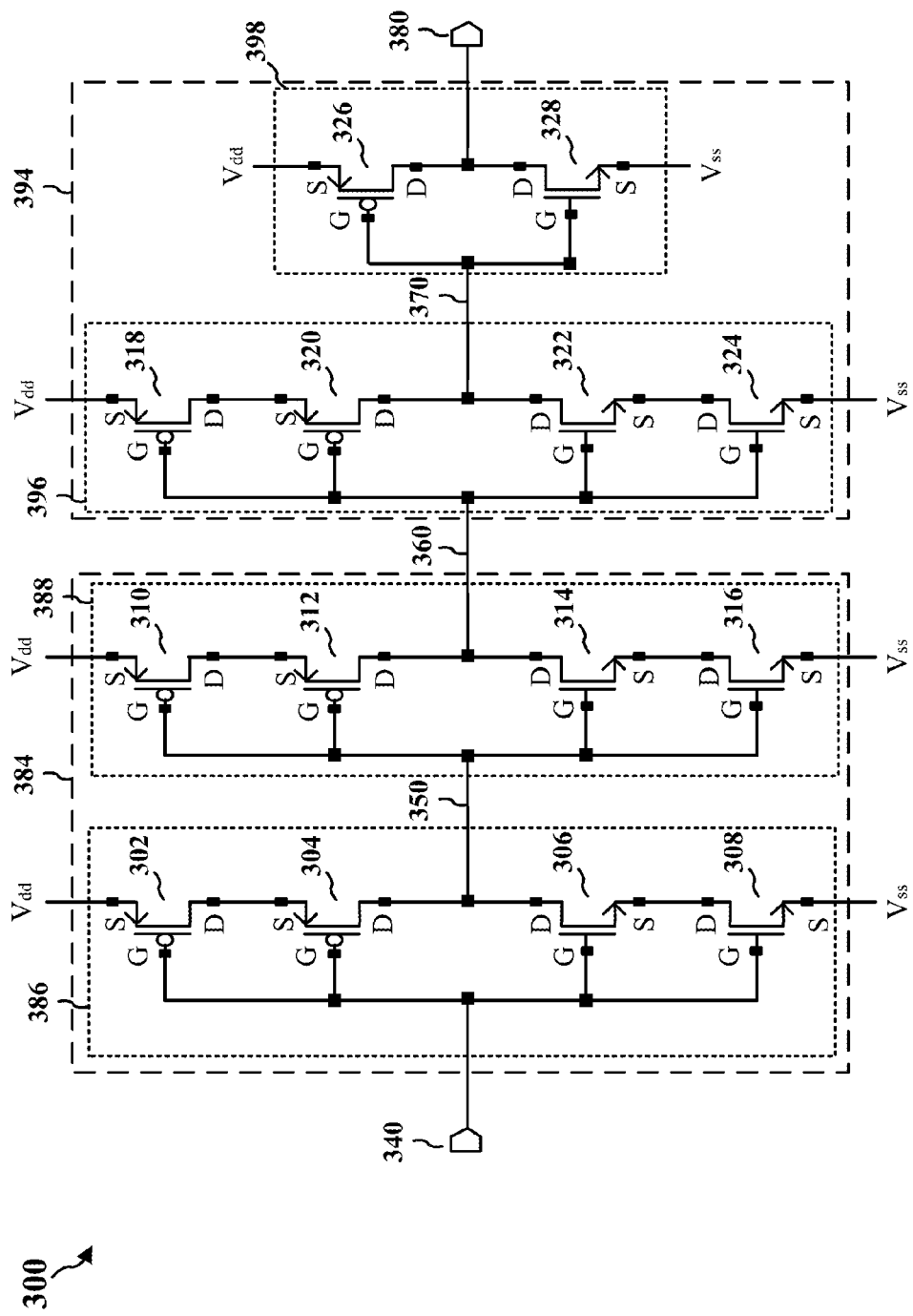
FIG. 3 is a circuit diagram of a two-stage delay buffer.

FIG. 3 is a circuit diagram of a two-stage delay buffer 300. The two-stage delay buffer 300, with an input 340 and an output 380, includes a first delay buffer 384 and a second delay buffer 394 connected in series. The first delay buffer 384, with the input 340 and an output at the node 360, includes the inverters 386 and 388 connected in series. The second delay buffer 394, with an input at the node 360 and the output 380, includes the inverters 396 and 398 connected in series. The inverter 386, with the input 340 and an output at the node 350, includes the pMOS transistors 302 and 304 and the nMOS transistors 306 and 308 connected in series. The inverter 388, with an input at the node 350 and an output at the node 360, includes the pMOS transistors 310 and 312 and the nMOS transistors 314 and 316 connected in series. The inverter 396, with an input at the node 360 and an output at the node 370, includes the pMOS transistors 318 and 320 and the nMOS transistors 322 and 324 connected in series. The inverter 398, with an input at the node 370 and the output 380, includes the pMOS transistor 326 and the nMOS transistor 328 connected in series.

The two-stage delay buffer 300 may provide larger delay than regular buffers and be extensively used for hold-time fixing. Referring again to FIG. 2, the exemplary layout of the pair of FinFETs has an increased time delay and a decreased drive strength in comparison to a MOS device in which the interconnect 206 and the interconnect 208 are connected together to form one FinFET. The time delay is increased because the current path is through two separate FinFETs rather than one FinFET. The drive strength is decreased because the transistor width is effectively halved for each FinFET by splitting one FinFET into a pair of stacked FinFETs. In an exemplary configuration, one or more of the pairs of transistors 302, 304; 306, 308; 310, 312; 314, 316; 318, 320; and 322, 324 may be constructed as illustrated in FIG. 2. In one configuration, one or more of the pairs of transistors 310, 312; 314, 316; 318, 320; and 322, 324 are constructed as illustrated in FIG. 2. In a subconfiguration, each of the pairs of transistors 310, 312; 314, 316; 318, 320; and 322, 324 are constructed as illustrated in FIG. 2.

Figure 4:
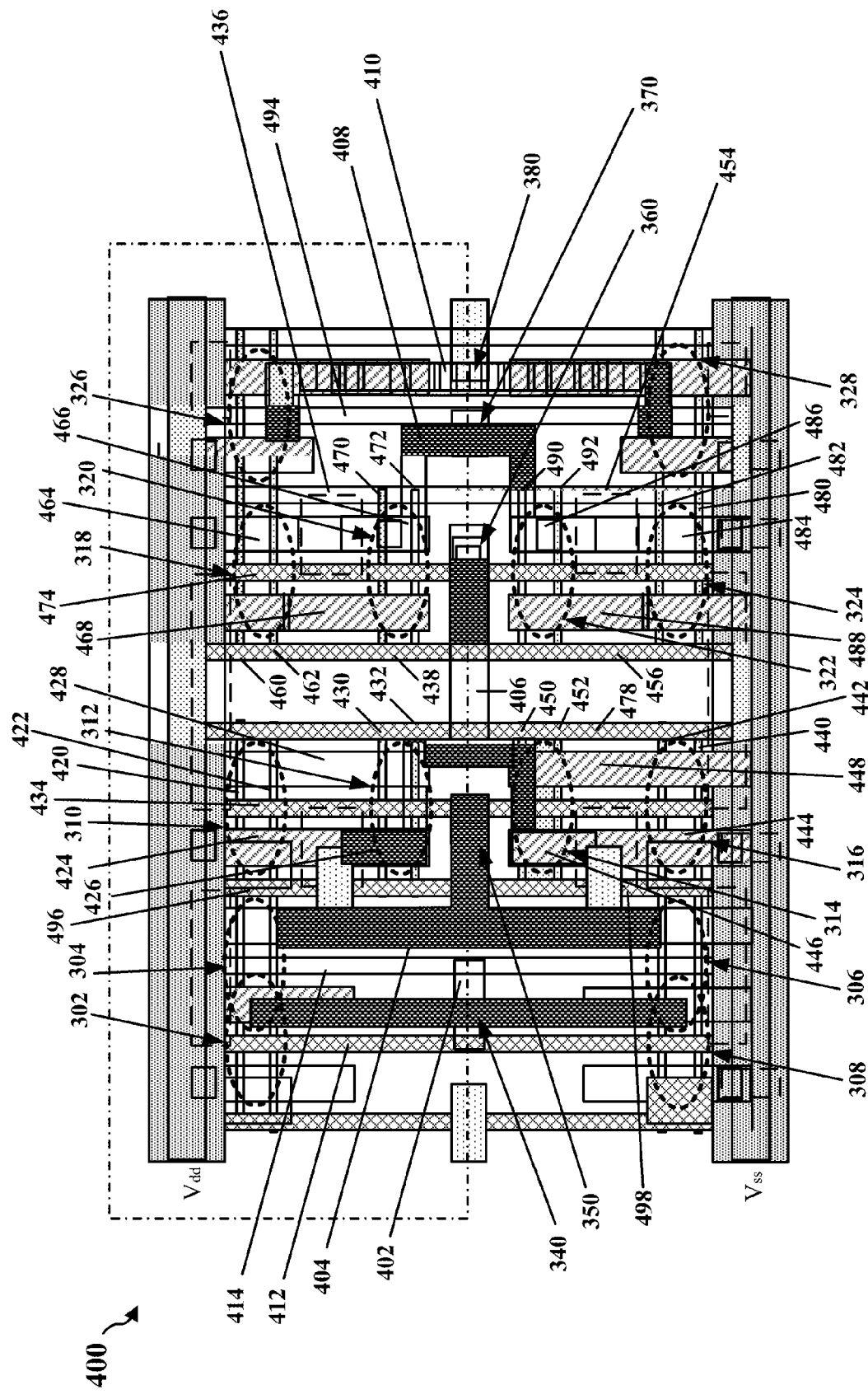
FIG. 4 is a diagram illustrating an exemplary layout configuration of a first standard cell corresponding to the circuit diagram of FIG. 3.

FIG. 4 is a diagram 400 illustrating an exemplary layout configuration of a first standard cell corresponding to the circuit diagram of FIG. 3. As shown in FIG. 4, the pMOS transistors 302, 304 are connected in series. A source of the pMOS transistor 302 is connected to $V_{dd}$. A drain of the pMOS transistor 302 is a source of the pMOS transistor 304. A drain of the pMOS transistor 304 is connected to the interconnect 404. The nMOS transistors 306, 308 are connected in series. A source of the nMOS transistor 308 is connected to $V_{ss}$. A drain of the nMOS transistor 308 is a source of the nMOS transistor 306. A drain of the nMOS transistor 306 is connected to the interconnect 404. The node 350 is at the interconnect 404. The gates of the pMOS transistor 302 and the nMOS transistor 308 are formed by a gate interconnect 412. The gates of the pMOS transistor 304 and the nMOS transistor 306 are formed by a gate interconnect 414. The gate interconnects 412, 414 are connected together by the interconnect 402. The input 340 is at the interconnect 402.

The pMOS transistors 310, 312 and the nMOS transistors 314, 316 are constructed as illustrated and described in relation to FIG. 2. Gates of the pMOS transistors 310, 312 are formed by the gate interconnect 434. An interconnect 424 connects together the fins 420, 422 to form the source of the pMOS transistor 310. The source of the pMOS transistor 310 is connected to $V_{dd}$. The gate interconnect 496 extends adjacent the source of the pMOS transistor 310. The fins 420, 422 extend through the gate interconnect 496. The fins 420, 422 may be considered to be tucked under or into the gate interconnect 496. The gate interconnect 496 is also connected to $V_{dd}$ in order to tie-off the corresponding gate and to isolate the pMOS transistors 304, 310 from each other. The drain of the pMOS transistor 310 is connected to the source of the pMOS transistor 312 by an interconnect 428. The interconnect 428 connects together the fins 420, 422 of the pMOS transistor 310 and the fins 430, 432 of the pMOS transistor 312. The fins 430, 432 extend through the gate interconnect 496. The fins 430, 432 may be considered to be tucked under or into the gate interconnect 496. The interconnect 428 and the fins 420, 422 form the drain of the pMOS transistor 310, and the interconnect 428 and the fins 430, 432 form the source of the pMOS transistor 312. An interconnect 426 connects together the fins 430, 432 to form the drain of the pMOS transistor 312. The drain of the pMOS transistor 312 is connected to an interconnect 406. Gates of the nMOS transistors 314, 316 are formed by the gate interconnect 434. An interconnect 444 connects together the fins 440, 442 to form the source of the nMOS transistor 316. The source of the nMOS transistor 316 is connected to $V_{ss}$. The gate interconnect 498 extends adjacent the source of the nMOS transistor 316. The fins 440, 442 extend through the gate interconnect 498. The fins 440, 442 may be considered to be tucked under or into the gate interconnect 498. The gate interconnect 498 is also connected to $V_{ss}$ in order to tie-off the corresponding gate and to isolate the nMOS transistors 306, 316 from each other. The drain of the nMOS transistor 316 is connected to the source of the nMOS transistor 314 by an interconnect 448. The interconnect 448 connects together the fins 440, 442 of the nMOS transistor 316 and the fins 450, 452 of the nMOS transistor 314. The fins 450, 452 extend through the gate interconnect 498. The fins 450, 452 may be considered to be tucked under or into the gate interconnect 498. The interconnect 448 and the fins 440, 442 form the drain of the nMOS transistor 316, and the interconnect 448 and the fins 450, 452 form the source of the nMOS transistor 314. An interconnect 446 connects together the fins 450, 452 to form the drain of the nMOS transistor 314. The drain of the nMOS transistor 314 is connected to the interconnect 406. The node 360 is at the interconnect 406.

The pMOS transistors 318, 320 and the nMOS transistors 322, 324 are constructed as illustrated and described in relation to FIG. 2. Gates of the pMOS transistors 318, 320 are formed by the gate interconnect 474. An interconnect 464 connects together the fins 460, 462 to form the source of the pMOS transistor 318. The source of the pMOS transistor 318 is connected to $V_{dd}$. The drain of the pMOS transistor 318 is connected to the source of the pMOS transistor 320 by an interconnect 468. The interconnect 468 connects together the fins 460, 462 of the pMOS transistor 318 and the fins 470, 472 of the pMOS transistor 320. The interconnect 468 and the fins 460, 462 form the drain of the pMOS transistor 318, and the interconnect 468 and the fins 470, 472 form the source of the pMOS transistor 320. An interconnect 466 connects together the fins 470, 472 to form the drain of the pMOS transistor 320. The drain of the pMOS transistor 320 is connected to an interconnect 408. Gates of the nMOS transistors 322, 324 are formed by the gate interconnect 474. An interconnect 484 connects together the fins 480, 482 to form the source of the nMOS transistor 324. The source of the nMOS transistor 324 is connected to $V_{ss}$. The drain of the nMOS transistor 324 is connected to the source of the nMOS transistor 322 by an interconnect 488. The interconnect 488 connects together the fins 480, 482 of the nMOS transistor 324 and the fins 490, 492 of the nMOS transistor 322. The interconnect 488 and the fins 480, 482 form the drain of the nMOS transistor 324, and the interconnect 488 and the fins 490, 492 form the source of the nMOS transistor 322. An interconnect 486 connects together the fins 490, 492 to form the drain of the nMOS transistor 322. The drain of the nMOS transistor 322 is connected to the interconnect 408. The node 370 is at the interconnect 408.

The node 370 is connected to the gate interconnect 494, which forms the gates of the pMOS transistor 326 and the nMOS transistor 328. A source of the pMOS transistor 326 is connected to $V_{dd}$. A source of the nMOS transistor 328 is connected to $V_{ss}$. Drains of the pMOS transistor 326 and the nMOS transistor 328 are connected together by an interconnect 410. The output 380 is at the interconnect 410.

Referring again to FIG. 4, a first FinFET 318 has a first transistor source, a first transistor drain, a first transistor gate, and a set of first transistor fins 460, 462. The set of first transistor fins 460, 462 extends from the first transistor gate and forms the first transistor source and the first transistor drain. A second FinFET 320 has a second transistor source, a second transistor drain, a second transistor gate, and a set of second transistor fins 470, 472. The set of second transistor fins 470, 472 extends from the second transistor gate and forms the second transistor source and the second transistor drain. A first gate interconnect 474 extends linearly to form the first transistor gate and the second transistor gate and to connect together the first transistor gate and the second transistor gate. The first transistor drain and the second transistor source are on a first side of the first gate interconnect 474. The first transistor source and the second transistor drain are on a second side of the first gate interconnect 474. A first interconnect 468 on the first side of the first gate interconnect 474 connects together the set of first transistor fins 460, 462 at the first transistor drain and the set of second transistor fins 470, 472 at the second transistor source. A second interconnect 464 on the second side of the first gate interconnect 474 connects together the set of first transistor fins 460, 462 at the first transistor source. A third interconnect 466 on the second side of the first gate interconnect 474 connects together the set of second transistor fins 470, 472 at the second transistor drain. The third interconnect 466 is disconnected from the second interconnect 464. A second gate interconnect 436 or 438 extends adjacent one of the first transistor source and the second transistor drain (gate interconnect 436) or the first transistor drain and the second transistor source (gate interconnect 438). The set of first transistor fins 460, 462 and the set of second transistor fins 470, 472 extending through the second gate interconnect 436 or 438.

The above description also describes the pairs of FinFETs 324, 322; 310, 312; and 316, 314. In one configuration, the first FinFET and the second FinFET are pMOS transistors. Accordingly, the first and second FinFETs may be the pair of FinFETs 310 and 312, respectively, or the pair of FinFETs 318 and 320, respectively. In one configuration, the first FinFET and the second FinFET are nMOS transistors. Accordingly, the first and second FinFETs may be the pair of FinFETs 316 and 314, respectively, or the pair of FinFETs 324 and 322, respectively.

In one configuration, the second gate interconnect is the gate interconnect 436 and the second gate interconnect 436 extends adjacent the first transistor source and the second transistor drain. Further, a third gate interconnect 438 extends adjacent the first transistor drain and the second transistor source. Referring to FIG. 4, the first transistor source is connected to a source voltage, and at least one of the gate interconnect 436 or the gate interconnect 438 is unconnected to a voltage such that the at least one of the gate interconnect 436 or the gate interconnect 438 is floating. As shown in FIG. 4, both the gate interconnect 436 and the gate interconnect 438 are floating.

A third FinFET 324 has a third transistor source, a third transistor drain, a third transistor gate, and a set of third transistor fins 480, 482. The set of third transistor fins 480, 482 extends from the third transistor gate and forms the third transistor source and the third transistor drain. A fourth FinFET 322 has a fourth transistor source, a fourth transistor drain, a fourth transistor gate, and a set of fourth transistor fins 490, 492. The gate interconnect 474 extends linearly to form the third transistor gate and the fourth transistor gate and to connect together the first transistor gate, the second transistor gate, the third transistor gate, and the fourth transistor gate. The set of fourth transistor fins 490, 492 extends from the fourth transistor gate and forms the fourth transistor source and the fourth transistor drain. The third transistor drain and the fourth transistor source may be on one of the first side or the second side of the gate interconnect 474. The third transistor source and the fourth transistor drain may be on an other one of the first side or the second side of the gate interconnect 474. As shown in FIG. 4, the third transistor drain and the fourth transistor source are on the first side of the gate interconnect 474 (the first side of the gate interconnect 474 was described supra as being the side of the gate interconnect 474 on which the first transistor drain and the second transistor source are located), and the third transistor source and the fourth transistor drain are on the second side of the gate interconnect 474 (the second side of the gate interconnect 474 was described supra as being the side of the gate interconnect 474 on which the first transistor source and the second transistor drain are located). A fourth interconnect 488 on the one of the first side or the second side (as shown in FIG. 4, the first side) of the gate interconnect 474 connects together the set of third transistor fins 480, 482 at the third transistor drain and the set of fourth transistor 490, 492 fins at the fourth transistor source. A fifth interconnect 484 on the other one of the first side or the second side (as shown in FIG. 4, the second side) of the gate interconnect 474 connects together the set of third transistor fins 480, 482 at the third transistor source. A sixth interconnect 486 on the other one of the first side or the second side (as shown in FIG. 4, the second side) of the gate interconnect 474 connects together the set of fourth transistor fins 490, 492 at the fourth transistor drain. The fifth interconnect 484 is disconnected from the sixth interconnect 486.

A gate interconnect 436 extends adjacent the first transistor source and the second transistor drain. The fins 460, 462 and the fins 470, 472 extend through the gate interconnect 436. The fins 460, 462 and the fins 470, 472 may be considered to be tucked under or into the gate interconnect 436. A gate interconnect 438 extends adjacent the first transistor drain and the second transistor source. The fins 460, 462 and the fins 470, 472 extend through the gate interconnect 438. The fins 460, 462 and the fins 470, 472 may be considered to be tucked under or into the gate interconnect 438. A gate interconnect 454 extends adjacent the third transistor source and the fourth transistor drain. The fins 480, 482 and the fins 490, 492 extend through the gate interconnect 454. The fins 480, 482 and the fins 490, 492 may be considered to be tucked under or into the gate interconnect 454. A gate interconnect 456 extends adjacent the third transistor drain and the fourth transistor source. The fins 480, 482 and the fins 490, 492 extend through the gate interconnect 456. The fins 480, 482 and the fins 490, 492 may be considered to be tucked under or into the gate interconnect 456. As shown in FIG. 4, the first transistor source is connected to a first source voltage $V_{dd}$ and the third transistor source is connected to a second source voltage $V_{ss}$. The gate interconnects 436, 438 are unconnected to a voltage such that the gate interconnects 436, 438 are floating, and the gate interconnects 454, 456 are unconnected to a voltage such that the gate interconnects 454, 456 are floating. The gate interconnect 436 and the gate interconnect 454 are formed from one gate interconnect, and the gate interconnect 438 and the gate interconnect 456 are formed from one gate interconnect.

A metal interconnect 408 connects the second transistor drain to the fourth transistor drain. The first, second, third, and fourth FinFETs 318, 320, 322, 324 operate as an inverter with an input 360 at the gate interconnect 474 and an output 370 at the metal interconnect 410.

A fifth FinFET 310 has a fifth transistor source, a fifth transistor drain, a fifth transistor gate, and a set of fifth transistor fins 420, 422. The set of fifth transistor fins 420, 422 extends from the fifth transistor gate and forms the fifth transistor source and the fifth transistor drain. A sixth FinFET 312 has a sixth transistor source, a sixth transistor drain, a sixth transistor gate, and a set of sixth transistor fins 430, 432. The set of sixth transistor fins 430, 432 extends from the sixth transistor gate and forms the sixth transistor source and the sixth transistor drain. A second gate interconnect 434 extends linearly to form the fifth transistor gate and the sixth transistor gate and to connect together the fifth transistor gate and the sixth transistor gate. The fifth transistor drain and the sixth transistor source are on a first side of the second gate interconnect 434. The fifth transistor source and the sixth transistor drain are on a second side of the second gate interconnect 434. A seventh interconnect 428 on the first side of the second gate interconnect 434 connects together the set of fifth transistor fins 420, 422 at the fifth transistor drain and the set of sixth transistor fins 430, 432 at the sixth transistor source. An eighth interconnect 424 on the second side of the second gate interconnect 434 connects together the set of fifth transistor fins 420, 422 at the fifth transistor source. A ninth interconnect 426 on the second side of the second gate interconnect 434 connects together the set of sixth transistor fins 430, 432 at the sixth transistor drain. The ninth interconnect 426 is disconnected from the eighth interconnect 424.

A seventh FinFET 316 has a seventh transistor source, a seventh transistor drain, a seventh transistor gate, and a set of seventh transistor fins 440, 442. The set of seventh transistor fins 440, 442 extends from the seventh transistor gate and forms the seventh transistor source and the seventh transistor drain. An eighth FinFET 314 has an eighth transistor source, an eighth transistor drain, an eighth transistor gate, and a set of eighth transistor fins 450, 452. The second gate interconnect 434 extends to form the seventh transistor gate and the eighth transistor gate and to connect together the fifth transistor gate, the sixth transistor gate, the seventh transistor gate, and the eighth transistor gate. The set of eighth transistor fins 450, 452 extends from the eighth transistor gate and forms the eighth transistor source and the eighth transistor drain. The seventh transistor drain and the eighth transistor source may be on one of the first side or the second side of the second gate interconnect 434. The seventh transistor source and the eighth transistor drain may be on an other one of the first side or the second side of the second gate interconnect.

As shown in FIG. 4, the seventh transistor drain and the eighth transistor source are on the first side of the second gate interconnect 434 (the first side of the second gate interconnect 434 was described supra as being the side of the gate interconnect 434 on which the fifth transistor drain and the sixth transistor source are located), and the third transistor source and the fourth transistor drain are on the second side of the second gate interconnect 434 (the second side of the second gate interconnect 434 was described supra as being the side of the gate interconnect 434 on which the fifth transistor source and the sixth transistor drain are located). A tenth interconnect 448 on the one of the first side or the second side (as shown in FIG. 4, the first side) of the second gate interconnect 434 connects together the set of seventh transistor fins 440, 442 at the seventh transistor drain and the set of eighth transistor fins 450, 452 at the eighth transistor source. An eleventh interconnect 444 on the other one of the first side or the second side (as shown in FIG. 4, the second side) of the second gate interconnect 434 connects together the set of seventh transistor fins 440, 442 at the seventh transistor source. A twelfth interconnect 446 on the other one of the first side or the second side (as shown in FIG. 4, the second side) of the second gate interconnect 434 connects together the set of eighth transistor fins 450, 452 at the eighth transistor drain. The twelfth interconnect 446 is disconnected from the eleventh interconnect 444.

A gate interconnect 478 extends adjacent the fifth transistor drain, the sixth transistor source, the seventh transistor drain, and the eighth transistor source. The fins 420, 422, 430, 432, 440, 442, 450, 452 extend through the gate interconnect 478. The fins 420, 422, 430, 432, 440, 442, 450, 452 may be considered to be tucked under or into the gate interconnect 478. The gate interconnect 478 may be unconnected to a voltage such that the gate interconnect 478 is floating. A second metal interconnect 406 connects together the sixth transistor drain, the eighth transistor drain, and the gate interconnect 474. The first, second, third, fourth, fifth, sixth, seventh, and eighth FinFETs 318, 320, 322, 324, 310, 312, 314, 316 operate together as a buffer with an input 350 at the second gate interconnect 434 and an output 370 at the metal interconnect 408. In one configuration, the first, second, fifth, and sixth FinFETs 318, 320, 310, 312 are pMOS transistors, and the third, fourth, seventh, and eighth FinFETs 322, 324, 314, 316 are nMOS transistors (FIG. 4 shows this configuration). In another configuration, the first, second, fifth, and sixth FinFETs are nMOS transistors, and the third, fourth, seventh, and eighth FinFETs are pMOS transistors. In such a configuration, the first, second, fifth, and sixth FinFETs are the FinFETs 324, 322, 316, and 314, respectively, and the third, fourth, seventh, and eighth FinFETs are the FinFETs 318, 320, 310, and 312, respectively.

A first inverter 302, 304, 306, 308 has a first inverter input 340 and a first inverter output 350. The first inverter output 350 is connected to the input 350 at the second gate interconnect 434. A second inverter 326, 328 has a second inverter input 370 and a second inverter output 380. The metal interconnect 408 is connected to the second inverter input 370. The first inverter (FinFETs 302, 304, 306, 308), the second inverter (FinFETs 326, 328), and the first, second, third, fourth, fifth, sixth, seventh, and eighth FinFETs (FinFETs 318, 320, 324, 322, 310, 312, 316, 314) operate together as a buffer with an input being the first inverter input 340 and an output being the second inverter output 380.

In one configuration, the FinFETs in the layout of FIG. 4 may be constructed with a 16 nm or 14 nm manufacturing process technology. The standard cell of FIG. 4 includes ten grids (nine full-gate interconnects plus two half-gate interconnects on edges of the standard cell). A layout configuration for the circuit of FIG. 3 that includes nine grids (one less grid) is provided infra with respect to FIG. 5.

Figure 5:
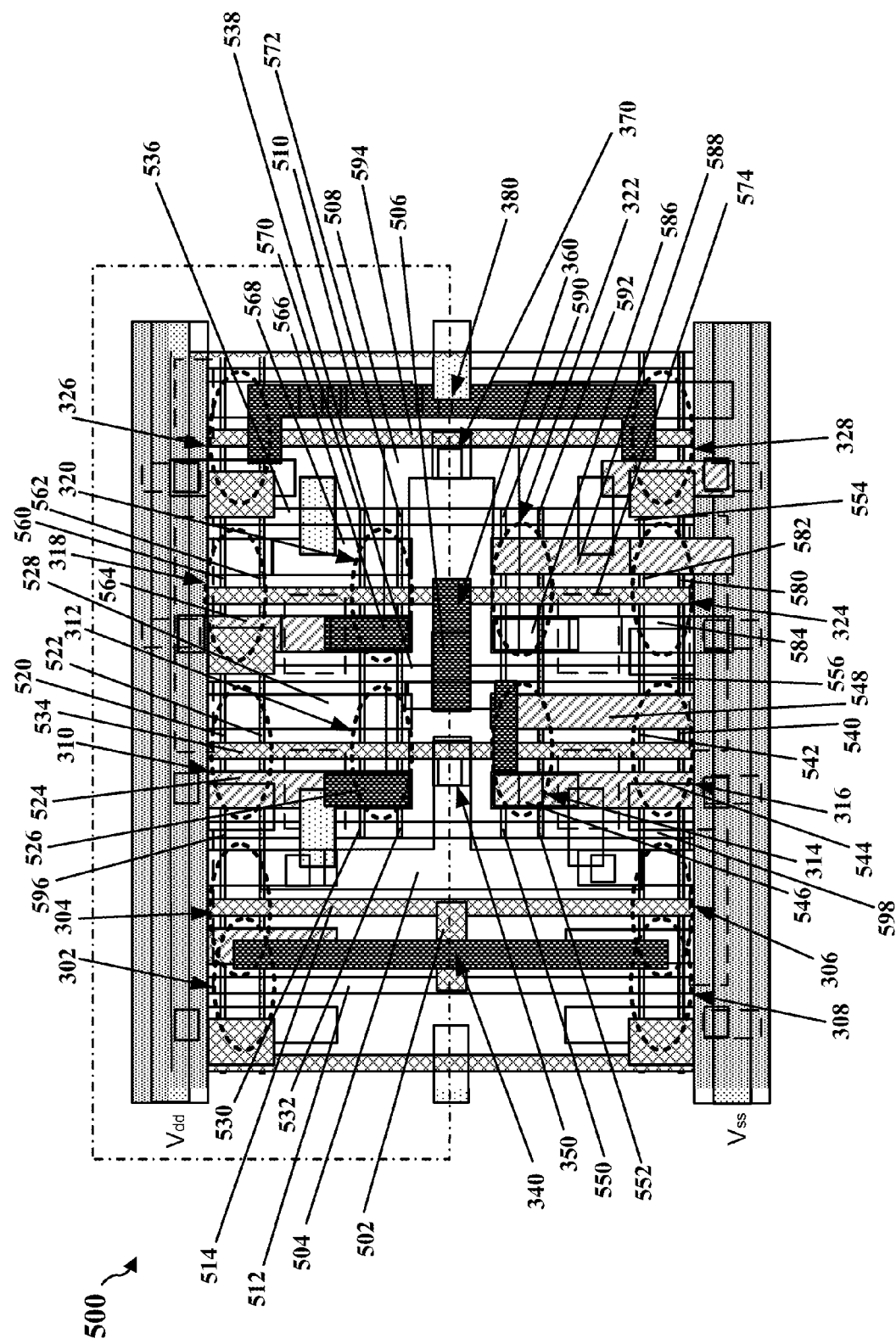
FIG. 5 is a diagram illustrating an exemplary layout configuration of a second standard cell corresponding to the circuit diagram of FIG. 3.

FIG. 5 is a diagram 500 illustrating an exemplary layout configuration of a second standard cell corresponding to the circuit diagram of FIG. 3. As shown in FIG. 5, the pMOS transistors 302, 304 are connected in series. A source of the pMOS transistor 302 is connected to $V_{dd}$. A drain of the pMOS transistor 302 is a source of the pMOS transistor 304. A drain of the pMOS transistor 304 is connected to the interconnect 504. The nMOS transistors 306, 308 are connected in series. A source of the nMOS transistor 308 is connected to $V_{ss}$. A drain of the nMOS transistor 308 is a source of the nMOS transistor 306. A drain of the nMOS transistor 306 is connected to the interconnect 504. The node 350 is at the interconnect 504. The gates of the pMOS transistor 302 and the nMOS transistor 308 are formed by a gate interconnect 512. The gates of the pMOS transistor 304 and the nMOS transistor 306 are formed by a gate interconnect 514. The gate interconnects 512, 514 are connected together by the interconnect 502. The input 340 is at the interconnect 502.

The pMOS transistors 310, 312 and the nMOS transistors 314, 316 are constructed as illustrated and described in relation to FIG. 2. Gates of the pMOS transistors 310, 312 are formed by the gate interconnect 534. An interconnect 524 connects together the fins 520, 522 to form the source of the pMOS transistor 310. The source of the pMOS transistor 310 is connected to $V_{dd}$. The gate interconnect 596 extends adjacent the source of the pMOS transistor 310. The fins 520, 522 extend through the gate interconnect 596. The fins 520, 522 may be considered to be tucked under or into the gate interconnect 596. The gate interconnect 596 is also connected to $V_{dd}$ in order to tie-off the corresponding gate and to isolate the pMOS transistors 304, 310 from each other. The drain of the pMOS transistor 310 is connected to the source of the pMOS transistor 312 by an interconnect 528. The interconnect 528 connects together the fins 520, 522 of the pMOS transistor 310 and the fins 530, 532 of the pMOS transistor 312. The fins 530, 532 extend through the gate interconnect 596. The fins 530, 532 may be considered to be tucked under or into the gate interconnect 596. The interconnect 528 and the fins 520, 522 form the drain of the pMOS transistor 310, and the interconnect 528 and the fins 530, 532 form the source of the pMOS transistor 312. An interconnect 526 connects together the fins 530, 532 to form the drain of the pMOS transistor 312. The drain of the pMOS transistor 312 is connected to an interconnect 506. Gates of the nMOS transistors 314, 316 are formed by the gate interconnect 534. An interconnect 544 connects together the fins 540, 542 to form the source of the nMOS transistor 316. The source of the nMOS transistor 316 is connected to $V_{ss}$. The gate interconnect 598 extends adjacent the source of the nMOS transistor 316. The fins 540, 542 extend through the gate interconnect 598. The fins 540, 542 may be considered to be tucked under or into the gate interconnect 598. The gate interconnect 598 is also connected to $V_{ss}$ in order to tie-off the corresponding gate and to isolate the nMOS transistors 306, 316 from each other. The drain of the nMOS transistor 316 is connected to the source of the nMOS transistor 314 by an interconnect 548. The interconnect 548 connects together the fins 540, 542 of the nMOS transistor 316 and the fins 550, 552 of the nMOS transistor 314. The fins 550, 552 extend through the gate interconnect 598. The fins 550, 552 may be considered to be tucked under or into the gate interconnect 598. The interconnect 548 and the fins 540, 542 form the drain of the nMOS transistor 316, and the interconnect 548 and the fins 550, 552 form the source of the nMOS transistor 314. An interconnect 546 connects together the fins 550, 552 to form the drain of the nMOS transistor 314. The drain of the nMOS transistor 314 is connected to the interconnect 506. The node 360 is at the interconnect 506.

The pMOS transistors 318, 320 and the nMOS transistors 322, 324 are constructed as illustrated and described in relation to FIG. 2. Gates of the pMOS transistors 318, 320 are formed by the gate interconnect 574. An interconnect 564 connects together the fins 560, 562 to form the source of the pMOS transistor 318. The source of the pMOS transistor 318 is connected to $V_{dd}$. The gate interconnect 538 extends adjacent the source of the pMOS transistor 318. The fins 560, 562 extend through the gate interconnect 538. The fins 560, 562 may be considered to be tucked under or into the gate interconnect 538. In addition, the fins 520, 522, 530, 532 extend through the gate interconnect 538. The fins 520, 522, 530, 532 may be considered to be tucked under or into the gate interconnect 538. The gate interconnect 538 is also connected to $V_{dd}$ in order to tie-off the corresponding gate and to isolate the pMOS transistors 318, 310 from each other. The drain of the pMOS transistor 318 is connected to the source of the pMOS transistor 320 by an interconnect 568. The interconnect 568 connects together the fins 560, 562 of the pMOS transistor 318 and the fins 570, 572 of the pMOS transistor 320. The fins 570, 572 extend through the gate interconnect 538. The fins 570, 572 may be considered to be tucked under or into the gate interconnect 538. The interconnect 568 and the fins 560, 562 form the drain of the pMOS transistor 318, and the interconnect 568 and the fins 570, 572 form the source of the pMOS transistor 320. An interconnect 566 connects together the fins 570, 572 to form the drain of the pMOS transistor 320. The drain of the pMOS transistor 320 is connected to an interconnect 508. Gates of the nMOS transistors 322, 324 are formed by the gate interconnect 574. An interconnect 584 connects together the fins 580, 582 to form the source of the nMOS transistor 324. The source of the nMOS transistor 324 is connected to $V_{ss}$. The gate interconnect 556 extends adjacent the source of the nMOS transistor 324. The fins 580, 582 extend through the gate interconnect 556. The fins 580, 582 may be considered to be tucked under or into the gate interconnect 556. In addition, the fins 540, 542 extend through the gate interconnect 556. The fins 540, 542 may be considered to be tucked under or into the gate interconnect 556. The gate interconnect 556 is also connected to $V_{ss}$ in order to tie-off the corresponding gate and to isolate the nMOS transistors 316, 324 from each other. The drain of the nMOS transistor 324 is connected to the source of the nMOS transistor 322 by an interconnect 588. The interconnect 588 connects together the fins 580, 582 of the nMOS transistor 324 and the fins 590, 592 of the nMOS transistor 322. The fins 590, 592 extend through the gate interconnect 556. The fins 590, 592 may be considered to be tucked under or into the gate interconnect 556. In addition, the fins 550, 552 extend through the gate interconnect 556. The fins 550, 552 may be considered to be tucked under or into the gate interconnect 556. The interconnect 588 and the fins 580, 582 form the drain of the nMOS transistor 324, and the interconnect 588 and the fins 590, 592 form the source of the nMOS transistor 322. An interconnect 586 connects together the fins 590, 592 to form the drain of the nMOS transistor 322. The drain of the nMOS transistor 322 is connected to the interconnect 508. The node 370 is at the interconnect 508.

The node 370 is connected to the gate interconnect 594, which forms the gates of the pMOS transistor 326 and the nMOS transistor 328. A source of the pMOS transistor 326 is connected to $V_{dd}$. The gate interconnect 536 extends adjacent the source of the pMOS transistor 326. The fins 560, 562, 570, 572 extend through the gate interconnect 536. The fins 560, 562, 570, 572 may be considered to be tucked under or into the gate interconnect 536. The gate interconnect 536 is also connected to $V_{dd}$ in order to tie-off the corresponding gate and to isolate the pMOS transistors 326, 318 from each other. A source of the nMOS transistor 328 is connected to $V_{ss}$. The gate interconnect 554 extends adjacent the source of the nMOS transistor 328. The fins 580, 582, 590, 592 extend through the gate interconnect 554. The fins 580, 582, 590, 592 may be considered to be tucked under or into the gate interconnect 554. The gate interconnect 554 is also connected to $V_{ss}$ in order to tie-off the corresponding gate and to isolate the nMOS transistors 328, 324 from each other. Drains of the pMOS transistor 326 and the nMOS transistor 328 are connected together by an interconnect 510. The output 380 is at the interconnect 510.

Referring again to FIG. 5, a first FinFET 318 has a first transistor source, a first transistor drain, a first transistor gate, and a set of first transistor fins 560, 562. The set of first transistor fins 560, 562 extends from the first transistor gate and forms the first transistor source and the first transistor drain. A second FinFET 320 has a second transistor source, a second transistor drain, a second transistor gate, and a set of second transistor fins 570, 572. The set of second transistor fins 570, 572 extends from the second transistor gate and forms the second transistor source and the second transistor drain. A first gate interconnect 574 extends linearly to form the first transistor gate and the second transistor gate and to connect together the first transistor gate and the second transistor gate. The first transistor drain and the second transistor source are on a first side of the first gate interconnect 574. The first transistor source and the second transistor drain are on a second side of the first gate interconnect 574. A first interconnect 568 on the first side of the first gate interconnect 574 connects together the set of first transistor fins 560, 562 at the first transistor drain and the set of second transistor fins 570, 572 at the second transistor source. A second interconnect 564 on the second side of the first gate interconnect 574 connects together the set of first transistor fins 560, 562 at the first transistor source. A third interconnect 566 on the second side of the first gate interconnect 574 connects together the set of second transistor fins 570, 572 at the second transistor drain. The third interconnect 566 is disconnected from the second interconnect 564. A second gate interconnect 536 or 538 extends adjacent one of the first transistor source and the second transistor drain (gate interconnect 538) or the first transistor drain and the second transistor source (gate interconnect 536). The set of first transistor fins 560, 562 and the set of second transistor fins 570, 572 extend through the second gate interconnect 536 or 538.

The above description also describes the pairs of FinFETs 324, 322; 310, 312; and 316, 314. In one configuration, the first FinFET and the second FinFET are pMOS transistors. Accordingly, the first and second FinFETs may be the pair of FinFETs 310 and 312, respectively, or the pair of FinFETs 318 and 320, respectively. In one configuration, the first FinFET and the second FinFET are nMOS transistors. Accordingly, the first and second FinFETs may be the pair of FinFETs 316 and 314, respectively, or the pair of FinFETs 324 and 322, respectively.

In one configuration, the second gate interconnect is the gate interconnect 538, and the second gate interconnect 538 extend adjacent the first transistor source and the second transistor drain. A third gate interconnect 536 extend adjacent the first transistor drain and the second transistor source. Referring to FIG. 5, the first transistor source is connected to a source voltage $V_{dd}$, and the gate interconnects 538, 536 are connected to the source voltage $V_{dd}$. The gate tie-off of the gate interconnect 538 has a stacked configuration, as two effective gates formed by the one gate interconnect 538 are tied off by the connection of the gate interconnect 538 to the source voltage. The tie-off of the gate interconnect 538 isolates the FinFET 318 from the FinFET 310, and isolates the FinFET 320 from the FinFET 312.

A third FinFET 324 has a third transistor source, a third transistor drain, a third transistor gate, and a set of third transistor fins 580, 582. The set of third transistor fins 580, 582 extends from the third transistor gate and forms the third transistor source and the third transistor drain. A fourth FinFET 322 has a fourth transistor source, a fourth transistor drain, a fourth transistor gate, and a set of fourth transistor fins 590, 592. The gate interconnect 574 extends linearly to form the third transistor gate and the fourth transistor gate and to connect together the first transistor gate, the second transistor gate, the third transistor gate, and the fourth transistor gate. The set of fourth transistor fins 590, 592 extends from the fourth transistor gate and forms the fourth transistor source and the fourth transistor drain. The third transistor drain and the fourth transistor source may be on one of the first side or the second side of the gate interconnect 574. The third transistor source and the fourth transistor drain may be on an other one of the first side or the second side of the gate interconnect 574. As shown in FIG. 5, the third transistor drain and the fourth transistor source are on the first side of the gate interconnect 574 (the first side of the gate interconnect 574 was described supra as being the side of the gate interconnect 574 on which the first transistor drain and the second transistor source are located), and the third transistor source and the fourth transistor drain are on the second side of the gate interconnect 574 (the second side of the gate interconnect 574 was described supra as being the side of the gate interconnect 574 on which the first transistor source and the second transistor drain are located). A fourth interconnect 588 on the one of the first side or the second side (as shown in FIG. 5, the first side) of the gate interconnect 574 connects together the set of third transistor fins 580, 582 at the third transistor drain and the set of fourth transistor 590, 592 fins at the fourth transistor source. A fifth interconnect 584 on the other one of the first side or the second side (as shown in FIG. 5, the second side) of the gate interconnect 574 connects together the set of third transistor fins 580, 582 at the third transistor source. A sixth interconnect 586 on the other one of the first side or the second side (as shown in FIG. 5, the second side) of the gate interconnect 574 connects together the set of fourth transistor fins 590, 592 at the fourth transistor drain. The fifth interconnect 584 is disconnected from the sixth interconnect 586.

A gate interconnect 538 extends adjacent the first transistor source and the second transistor drain. A gate interconnect 536 extends adjacent the first transistor drain and the second transistor source. A gate interconnect 556 extends adjacent the third transistor source and the fourth transistor drain. A gate interconnect 554 extends adjacent the third transistor drain and the fourth transistor source.

As shown in FIG. 5, the first transistor source is connected to a first source voltage $V_{dd}$ and the third transistor source is connected to a second source voltage $V_{ss}$. The gate interconnects 538, 536 are connected to the first source voltage $V_{dd}$, and the gate interconnects 556, 554 are connected to the second source voltage $V_{ss}$. The gate tie-off of the gate interconnect 556 has a stacked configuration, as two effective gates formed by the one gate interconnect 556 are tied off by the connection of the gate interconnect 556 to the source voltage. The tie-off of the gate interconnect 556 isolates the FinFET 324 from the FinFET 316, and isolates the FinFET 322 from the FinFET 314.

A metal interconnect 508 connects the second transistor drain to the fourth transistor drain. The first, second, third, and fourth FinFETs 318, 320, 322, 324 operate as an inverter with an input 360 at the gate interconnect 574 and an output 370 at the metal interconnect 510.

A fifth FinFET 310 has a fifth transistor source, a fifth transistor drain, a fifth transistor gate, and a set of fifth transistor fins 520, 522. The set of fifth transistor fins 520, 522 extends from the fifth transistor gate and forms the fifth transistor source and the fifth transistor drain. A sixth FinFET 312 has a sixth transistor source, a sixth transistor drain, a sixth transistor gate, and a set of sixth transistor fins 530, 532. The set of sixth transistor fins 530, 532 extends from the sixth transistor gate and forms the sixth transistor source and the sixth transistor drain. A second gate interconnect 534 extends linearly to form the fifth transistor gate and the sixth transistor gate and to connect together the fifth transistor gate and the sixth transistor gate. The fifth transistor drain and the sixth transistor source are on a first side of the second gate interconnect 534. The fifth transistor source and the sixth transistor drain are on a second side of the second gate interconnect 534. A seventh interconnect 528 on the first side of the second gate interconnect 534 connects together the set of fifth transistor fins 520, 522 at the fifth transistor drain and the set of sixth transistor fins 530, 532 at the sixth transistor source. An eighth interconnect 524 on the second side of the second gate interconnect 534 connects together the set of fifth transistor fins 520, 522 at the fifth transistor source. A ninth interconnect 526 on the second side of the second gate interconnect 534 connects together the set of sixth transistor fins 530, 532 at the sixth transistor drain. The ninth interconnect 526 is disconnected from the eighth interconnect 524.

A seventh FinFET 316 has a seventh transistor source, a seventh transistor drain, a seventh transistor gate, and a set of seventh transistor fins 540, 542. The set of seventh transistor fins 540, 542 extends from the seventh transistor gate and forms the seventh transistor source and the seventh transistor drain. An eighth FinFET 314 has an eighth transistor source, an eighth transistor drain, an eighth transistor gate, and a set of eighth transistor fins 550, 552. The second gate interconnect 534 extends to form the seventh transistor gate and the eighth transistor gate and to connect together the fifth transistor gate, the sixth transistor gate, the seventh transistor gate, and the eighth transistor gate. The set of eighth transistor fins 550, 552 extends from the eighth transistor gate and forms the eighth transistor source and the eighth transistor drain. The seventh transistor drain and the eighth transistor source may be on one of the first side or the second side of the second gate interconnect 534. The seventh transistor source and the eighth transistor drain may be on an other one of the first side or the second side of the second gate interconnect.

As shown in FIG. 5, the seventh transistor drain and the eighth transistor source are on the first side of the second gate interconnect 534 (the first side of the second gate interconnect 534 was described supra as being the side of the gate interconnect 534 on which the fifth transistor drain and the sixth transistor source are located), and the third transistor source and the fourth transistor drain are on the second side of the second gate interconnect 534 (the second side of the second gate interconnect 534 was described supra as being the side of the gate interconnect 534 on which the fifth transistor source and the sixth transistor drain are located). A tenth interconnect 548 on the one of the first side or the second side (as shown in FIG. 5, the first side) of the second gate interconnect 534 connects together the set of seventh transistor fins 540, 542 at the seventh transistor drain and the set of eighth transistor fins 550, 552 at the eighth transistor source. An eleventh interconnect 544 on the other one of the first side or the second side (as shown in FIG. 5, the second side) of the second gate interconnect 534 connects together the set of seventh transistor fins 540, 542 at the seventh transistor source. A twelfth interconnect 546 on the other one of the first side or the second side (as shown in FIG. 5, the second side) of the second gate interconnect 534 connects together the set of eighth transistor fins 550, 552 at the eighth transistor drain. The twelfth interconnect 546 is disconnected from the eleventh interconnect 544.

A second metal interconnect 506 connects together the sixth transistor drain, the eighth transistor drain, and the gate interconnect 574. The first, second, third, fourth, fifth, sixth, seventh, and eighth FinFETs 318, 320, 322, 324, 310, 312, 314, 316 operate together as a buffer with an input 350 at the second gate interconnect 534 and an output 370 at the metal interconnect 508. In one configuration, the first, second, fifth, and sixth FinFETs 318, 320, 310, 312 are pMOS transistors, and the third, fourth, seventh, and eighth FinFETs 322, 324, 314, 316 are nMOS transistors (FIG. 5 shows this configuration). In another configuration, the first, second, fifth, and sixth FinFETs are nMOS transistors, and the third, fourth, seventh, and eighth FinFETs are pMOS transistors. In such a configuration, the first, second, fifth, and sixth FinFETs are the FinFETs 324, 322, 316, and 314, respectively, and the third, fourth, seventh, and eighth FinFETs are the FinFETs 318, 320, 310, and 312, respectively.

A first inverter 302, 304, 306, 308 has a first inverter input 340 and a first inverter output 350. The first inverter output 350 is connected to the input 350 at the second gate interconnect 534. A second inverter 326, 328 has a second inverter input 370 and a second inverter output 380. The metal interconnect 508 is connected to the second inverter input 370. The first inverter (FinFETs 302, 304, 306, 308), the second inverter (FinFETs 326, 328), and the first, second, third, fourth, fifth, sixth, seventh, and eighth FinFETs (FinFETs 318, 320, 324, 322, 310, 312, 316, 314) operate together as a buffer with an input being the first inverter input 340 and an output being the second inverter output 380.

In one configuration, the FinFETs in the layout of FIG. 5 may be constructed with a 16 nm or 14 nm manufacturing process technology. The standard cell of FIG. 5 includes nine grids (eight full-gate interconnects plus two half-gate interconnects on edges of the standard cell).

Figure 6:
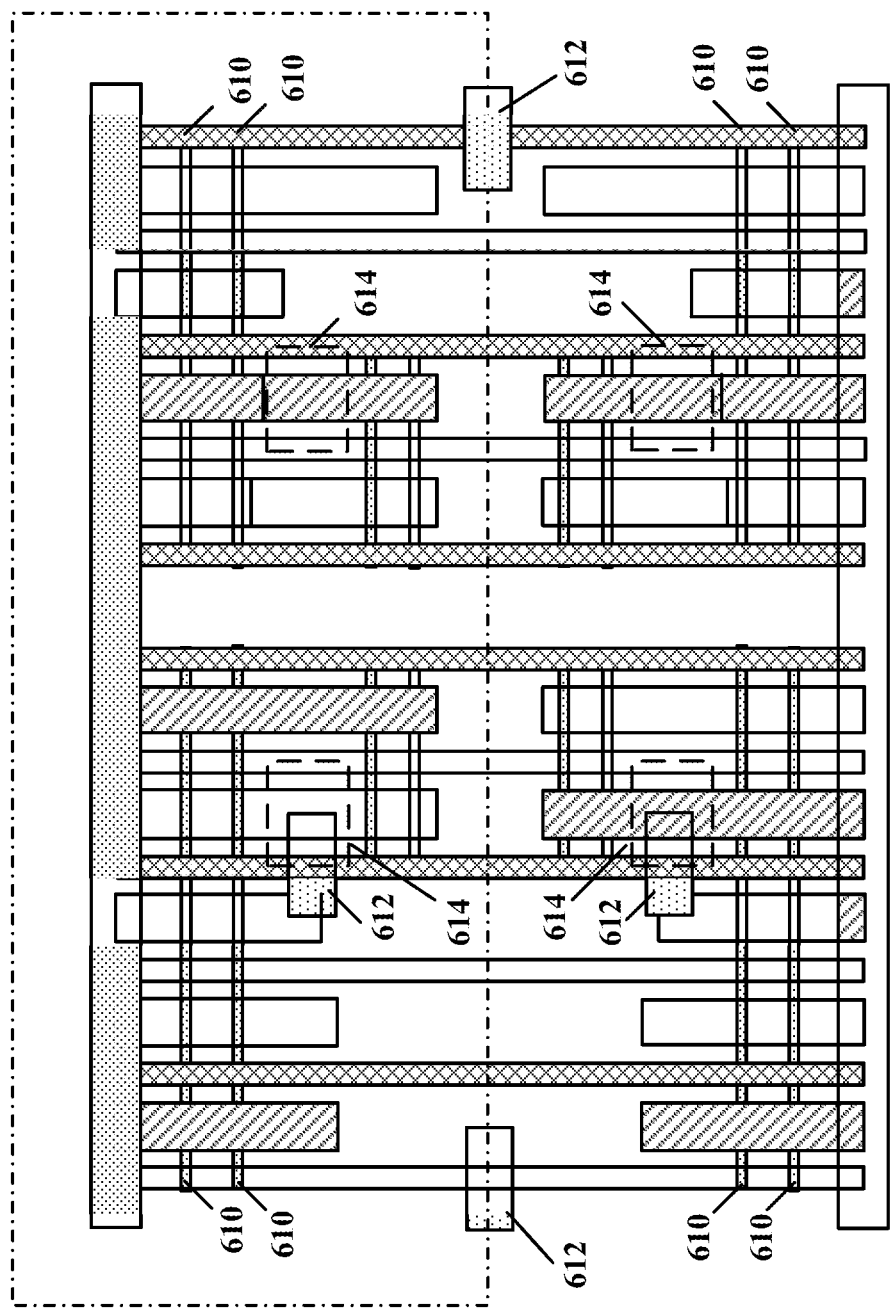
FIG. 6 is a second diagram illustrating the exemplary layout configuration of the first standard cell.

FIG. 6 is a second diagram 600 illustrating the exemplary layout configuration of the first standard cell. The layout in the diagram 600 corresponds to the layout in the diagram 400 of FIG. 4. The diagram 600 includes less layers in order to show the fins 610, the locations 612 in which the gate interconnects are cut (also referred to as "cut poly"), and the locations 614 in which the fin interconnects are cut (separated) to form the stacked pair of transistors as described supra in relation to FIG. 2.

Figure 7:
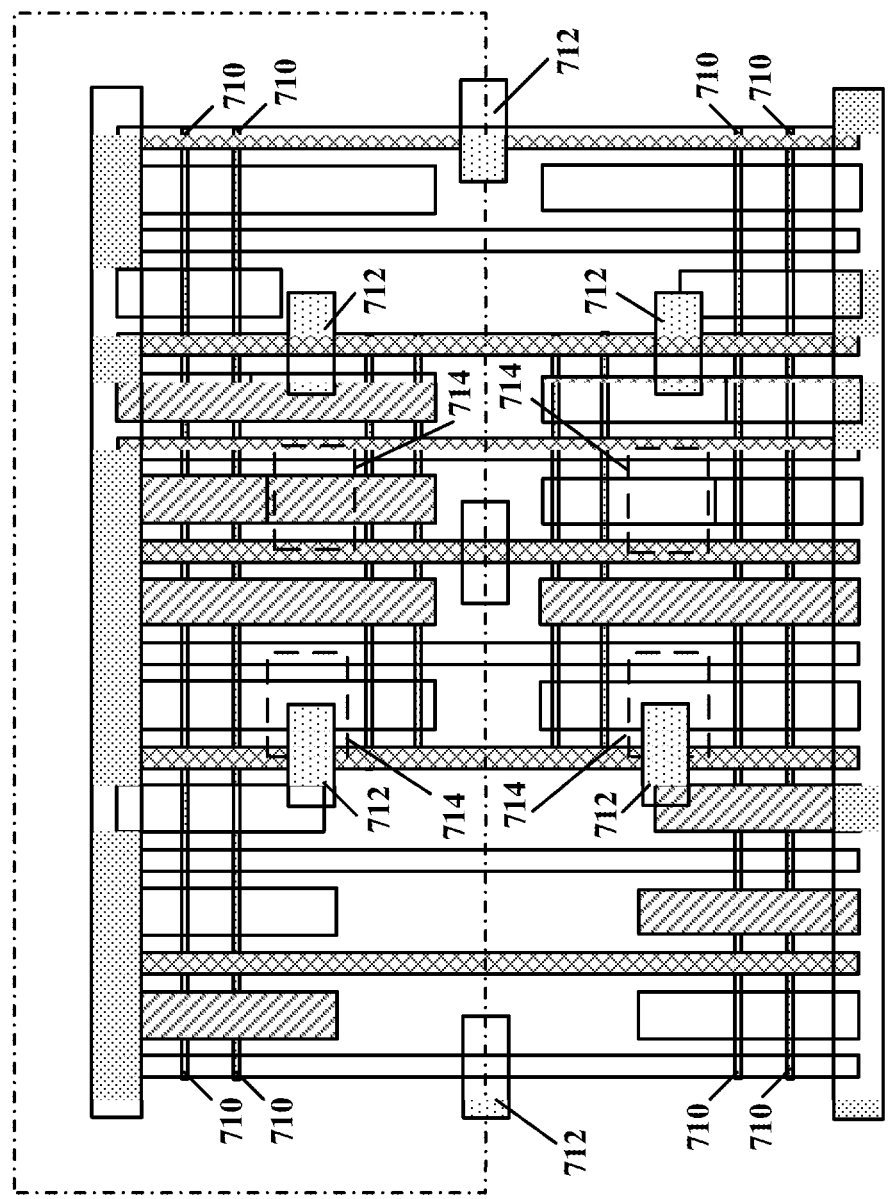
FIG. 7 is a second diagram illustrating the exemplary layout configuration of the second standard cell.

FIG. 7 is a second diagram 700 illustrating the exemplary layout configuration of the second standard cell. The layout in the diagram 700 corresponds to the layout in the diagram 500 of FIG. 5. The diagram 700 includes less layers in order to show the fins 710, the locations 712 in which the gate interconnects are cut, and the locations 714 in which the fin interconnects are cut (separated) to form the stacked pair of transistors as described supra in relation to FIG. 2.

Figure 8:
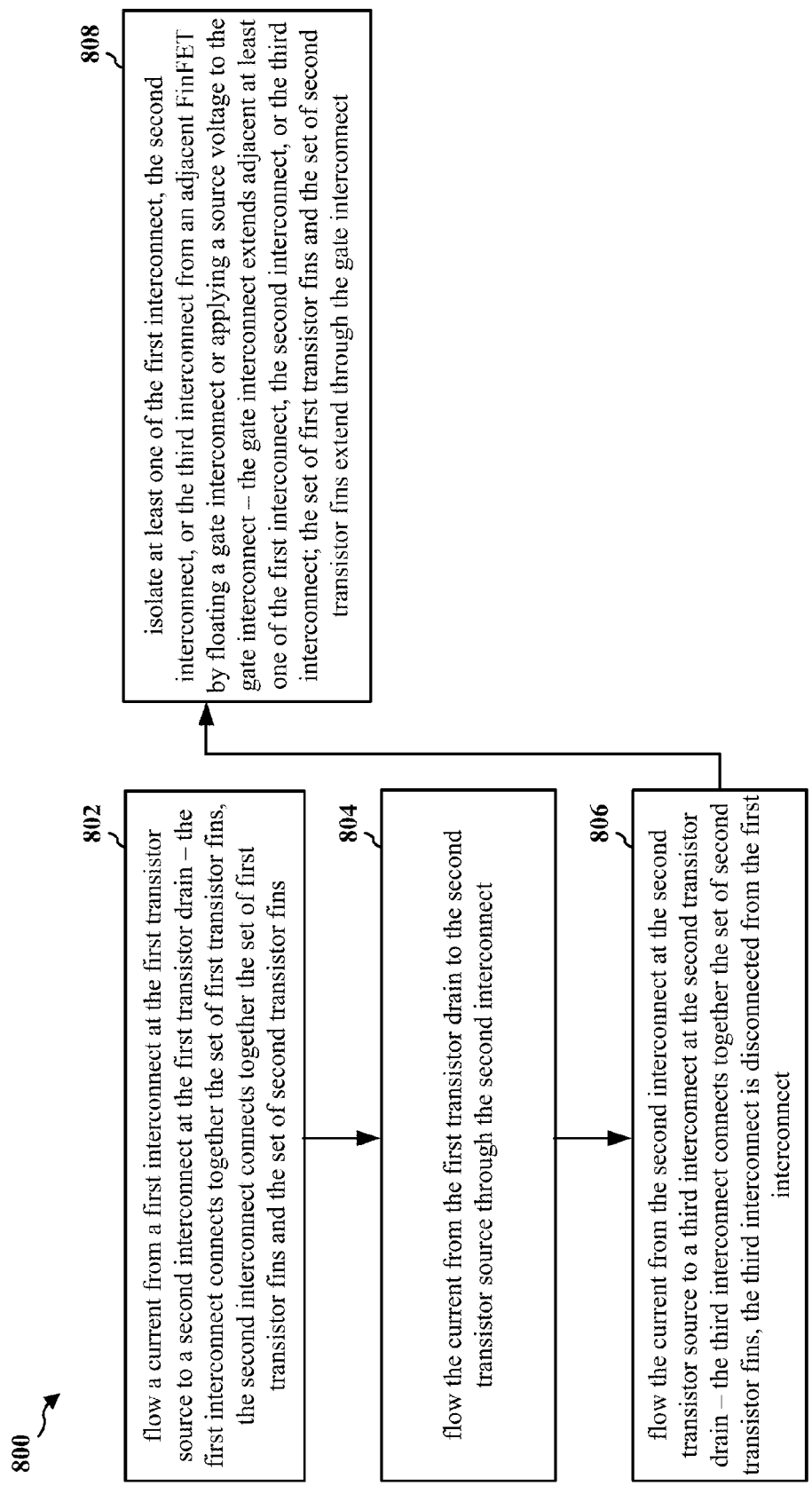
FIG. 8 is a flow chart of an exemplary method of a MOS device.

FIG. 8 is a flow chart of an exemplary method of a MOS device. The device includes a first FinFET having a first transistor source, a first transistor drain, a first transistor gate, and a set of first transistor fins. The device further includes a second FinFET having a second transistor source, a second transistor drain, a second transistor gate, and a set of second transistor fins. In step 802, a current flows from a first interconnect at the first transistor source to a second interconnect at the first transistor drain. The first interconnect connects together the set of first transistor fins. The second interconnect connects together the set of first transistor fins and the set of second transistor fins. In step 804, the current flows from the first transistor drain to the second transistor source through the second interconnect. In step 806, the current flows from the second interconnect at the second transistor source to a third interconnect at the second transistor drain. The third interconnect connects together the set of second transistor fins. The third interconnect is disconnected from the first interconnect. In step 808, at least one of the first interconnect, the second interconnect, or the third interconnect is isolated from an adjacent FinFET by floating a gate interconnect or applying a source voltage (gate tie-off) to the gate interconnect. Applying the source voltage to the gate interconnect ties off the gate interconnect. The gate interconnect extends adjacent at least one of the first interconnect, the second interconnect, or the third interconnect. The set of first transistor fins and the set of second transistor fins extend through the gate interconnect. The first transistor gate and the second transistor gate may be formed of a same gate interconnect that extends linearly and parallel to the first, second, and third interconnects and orthogonal to the set of first transistor fins and the set of second transistor fins. The first and second FinFETs may be both pMOS transistors or may be both nMOS transistors.

For example, referring to FIG. 2, the device includes a first FinFET 202 having a first transistor source 252, a first transistor drain 254, a first transistor gate 256, and a set of first transistor fins 220, 222. The device further includes a second FinFET 204 having a second transistor source 264, a second transistor drain 262, a second transistor gate 266, and a set of second transistor fins 224, 226. When the device is in operation, a current flows from a first interconnect 206 at the first transistor source 252 to a second interconnect 210 at the first transistor drain 254. The first interconnect 206 connects together the set of first transistor fins 220, 222. The second interconnect 210 connects together the set of first transistor fins 220, 222 and the set of second transistor fins 224, 226. The current flows from the first transistor drain 254 to the second transistor source 264 through the second interconnect 210. The current flows from the second interconnect 210 at the second transistor source 264 to a third interconnect 208 at the second transistor drain 262. The third interconnect 208 connects together the set of second transistor fins 224, 226. The third interconnect 208 is disconnected from the first interconnect 206. The first transistor gate 256 and the second transistor gate 266 is formed of a same gate interconnect 212 that extends linearly and parallel to the first, second, and third interconnects 206, 210, and 208, respectively, and orthogonal to the set of first transistor fins 220, 222 and the set of second transistor fins 224, 226. The first and second FinFETs 202, 204 may be both pMOS transistors or may be both nMOS transistors. When the first and second FinFETs 202, 204 are pMOS transistors, the device is in operation when a "low" (e.g., $V_{ss}$) voltage is applied to the gate interconnect 212, and when the first and second FinFETs 202, 204 are nMOS transistors, the device is in operation when a "high" (e.g., $V_{dd}$) voltage is applied to the gate interconnect 212. For further example, referring to FIG. 4 and FIG. 5, the FinFETs 318, 320 are isolated from adjacent FinFETs by floating the gate interconnects 436, 438 (FIG. 4), or by applying a source voltage to the gate interconnects 536, 538 (FIG. 5). The set of first transistor fins 460, 462, 560, 562 and the set of second transistor fins 470, 472, 570, 572 extend through the gate interconnects 436, 438, 536, 538. For further examples, see also the FinFETs 310, 312; 314, 316; and 322, 324.

In one configuration, a MOS device includes first FinFET having a first transistor source, a first transistor drain, a first transistor gate, and a set of first transistor fins. The MOS device further includes a second FinFET having a second transistor source, a second transistor drain, a second transistor gate, and a set of second transistor fins. The MOS device further includes means for flowing a current from a first interconnect at the first transistor source to a second interconnect at the first transistor drain. The first interconnect connects together the set of first transistor fins. The second interconnect connects together the set of first transistor fins and the set of second transistor fins. The MOS device further includes means for flowing the current from the first transistor drain to the second transistor source through the second interconnect. The MOS device further includes means for flowing the current from the second interconnect at the second transistor source to a third interconnect at the second transistor drain. The third interconnect connects together the set of second transistor fins. The third interconnect is disconnected from the first interconnect. The MOS device further includes means for isolating at least one of the first interconnect, the second interconnect, or the third interconnect from an adjacent FinFET by floating a gate interconnect or applying a source voltage (gate tie-off) to the gate interconnect. The gate interconnect extends adjacent at least one of the first interconnect, the second interconnect, or the third interconnect. The set of first transistor fins and the set of second transistor fins extend through (e.g., tuck under or tuck into) the gate interconnect.

Exemplary standard cell layouts are provided in FIGS. 4-7 for the circuit described in relation to FIG. 3. Pairs of FinFETs, such as the FinFET pairs 310, 312; 314, 316; 318, 320; and 322, 324 may be constructed as described in relation to FIG. 2. The first standard cell layout (FIGS. 4, 6) include a break in an active region between the gate interconnect 478 and the gate interconnects 438, 456. The second standard cell layout (FIGS. 5, 7) has a continuous active region. Because the first standard cell layout has less gate tie-offs than the second standard cell layout, the first standard cell layout has a lower leakage current than the second standard cell layout. However, the second standard cell layout has a better area optimization than the first standard cell layout (a 10% area footprint reduction), as the first standard cell layout utilizes ten grids and the second standard cell layout utilizes nine grids.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal oxide semiconductor device, comprising:
   a first fin field effect transistor (FinFET) having a first transistor source, a first transistor drain, a first transistor gate, and a set of first transistor fins, the set of first transistor fins extending from the first transistor gate and forming the first transistor source and the first transistor drain;
   a second FinFET having a second transistor source, a second transistor drain, a second transistor gate, and a set of second transistor fins, the set of second transistor fins extending from the second transistor gate and forming the second transistor source and the second transistor drain;
   a first gate interconnect extending linearly to form the first transistor gate and the second transistor gate and to connect together the first transistor gate and the second transistor gate, the first transistor drain and the second transistor source being on a first side of the first gate interconnect, the first transistor source and the second transistor drain being on a second side of the first gate interconnect;
   a first interconnect on the first side of the first gate interconnect that connects together the set of first transistor fins at the first transistor drain and the set of second transistor fins at the second transistor source;
   a second interconnect on the second side of the first gate interconnect that connects together the set of first transistor fins at the first transistor source;
   a third interconnect on the second side of the first gate interconnect that connects together the set of second transistor fins at the second transistor drain, the third interconnect being disconnected from the second interconnect;
   a second gate interconnect extending adjacent one of the first transistor source and the second transistor drain or the first transistor drain and the second transistor source, the set of first transistor fins and the set of second transistor fins extending through the second gate interconnect.

2. The device of claim 1, wherein the first FinFET and the second FinFET are p-type metal oxide semiconductor (pMOS) transistors.

3. The device of claim 1, wherein the first FinFET and the second FinFET are n-type metal oxide semiconductor (nMOS) transistors.

4. The device of claim 1, wherein the second gate interconnect extends adjacent the first transistor source and the second transistor drain, and the metal oxide semiconductor device further comprises a third gate interconnect extending adjacent the first transistor drain and the second transistor source.

5. The device of claim 4, wherein the first transistor source is connected to a source voltage, and at least one of the second gate interconnect or the third gate interconnect is unconnected to a voltage such that the at least one of the second gate interconnect or the third gate interconnect is floating.

6. The device of claim 4, wherein the first transistor source is connected to a source voltage, and the second and third gate interconnects are connected to the source voltage.

7. The device of claim 1, further comprising:
a third FinFET having a third transistor source, a third transistor drain, a third transistor gate, and a set of third transistor fins, the set of third transistor fins extending from the third transistor gate and forming the third transistor source and the third transistor drain;
a fourth FinFET having a fourth transistor source, a fourth transistor drain, a fourth transistor gate, and a set of fourth transistor fins, the first gate interconnect extending linearly to form the third transistor gate and the fourth transistor gate and to connect together the first transistor gate, the second transistor gate, the third transistor gate, and the fourth transistor gate, the set of fourth transistor fins extending from the fourth transistor gate and forming the fourth transistor source and the fourth transistor drain, the third transistor drain and the fourth transistor source being on one of the first side or the second side of the first gate interconnect, the third transistor source and the fourth transistor drain being on an other one of the first side or the second side of the first gate interconnect;
a fourth interconnect on said one of the first side or the second side of the first gate interconnect that connects together the set of third transistor fins at the third transistor drain and the set of fourth transistor fins at the fourth transistor source;
a fifth interconnect on said other one of the first side or the second side of the first gate interconnect that connects together the set of third transistor fins at the third transistor source; and
a sixth interconnect on said other one of the first side or the second side of the first gate interconnect that connects together the set of fourth transistor fins at the fourth transistor drain, the fifth interconnect being disconnected from the sixth interconnect.

8. The device of claim 7, first comprising:
a second gate interconnect extending adjacent the first transistor source and the second transistor drain;
a third gate interconnect extending adjacent the first transistor drain and the second transistor source;
a fourth gate interconnect extending adjacent the third transistor source and the fourth transistor drain; and
a fifth gate interconnect extending adjacent the third transistor drain and the fourth transistor source.

9. The device of claim 8, wherein the first transistor source is connected to a first source voltage and the third transistor source is connected to a second source voltage, the second and third gate interconnects are unconnected to a voltage such that the second and third gate interconnects are floating, and the fourth and fifth gate interconnects are unconnected to a voltage such that the fourth and fifth gate interconnects are floating, wherein the second gate interconnect and the fourth gate interconnect are formed from one gate interconnect, and the third gate interconnect and the fifth gate interconnect are formed from one gate interconnect.

10. The device of claim 8, wherein the first transistor source is connected to a first source voltage and the third transistor source is connected to a second source voltage, the second and third gate interconnects are connected to the first source voltage, and the fourth and fifth gate interconnects are connected to the second source voltage.

11. The device of claim 7, further comprising a metal interconnect connecting the second transistor drain to the fourth transistor drain, wherein the first, second, third, and fourth FinFETs operate as an inverter with an input at the first gate interconnect and an output at the metal interconnect.

12. The device of claim 11, further comprising:
a fifth FinFET having a fifth transistor source, a fifth transistor drain, a fifth transistor gate, and a set of fifth transistor fins, the set of fifth transistor fins extending from the fifth transistor gate and forming the fifth transistor source and the fifth transistor drain;
a sixth FinFET having a sixth transistor source, a sixth transistor drain, a sixth transistor gate, and a set of sixth transistor fins, the set of sixth transistor fins extending from the sixth transistor gate and forming the sixth transistor source and the sixth transistor drain;
a second gate interconnect extending linearly to form the fifth transistor gate and the sixth transistor gate and to connect together the fifth transistor gate and the sixth transistor gate, the fifth transistor drain and the sixth transistor source being on a first side of the second gate interconnect, the fifth transistor source and the sixth transistor drain being on a second side of the second gate interconnect;
a seventh interconnect on the first side of the second gate interconnect that connects together the set of fifth transistor fins at the fifth transistor drain and the set of sixth transistor fins at the sixth transistor source;
an eighth interconnect on the second side of the second gate interconnect that connects together the set of fifth transistor fins at the fifth transistor source; and
a ninth interconnect on the second side of the second gate interconnect that connects together the set of sixth transistor fins at the sixth transistor drain, the ninth interconnect being disconnected from the eighth interconnect.

13. The device of claim 12, further comprising:
a seventh FinFET having a seventh transistor source, a seventh transistor drain, a seventh transistor gate, and a set of seventh transistor fins, the set of seventh transistor fins extending from the seventh transistor gate and forming the seventh transistor source and the seventh transistor drain;
an eighth FinFET having an eighth transistor source, an eighth transistor drain, an eighth transistor gate, and a set of eighth transistor fins, the second gate interconnect extending to form the seventh transistor gate and the eighth transistor gate and to connect together the fifth transistor gate, the sixth transistor gate, the seventh transistor gate, and the eighth transistor gate, the set of eighth transistor fins extending from the eighth transistor gate and forming the eighth transistor source and the eighth transistor drain, the seventh transistor drain and the eighth transistor source being on one of the first side or the second side of the second gate interconnect, the seventh transistor source and the eighth transistor drain being on an other one of the first side or the second side of the second gate interconnect;
a tenth interconnect on said one of the first side or the second side of the second gate interconnect that connects together the set of seventh transistor fins at the seventh transistor drain and the set of eighth transistor fins at the eighth transistor source;
an eleventh interconnect on said other one of the first side or the second side of the second gate interconnect that connects together the set of seventh transistor fins at the seventh transistor source; and a twelfth interconnect on said other one of the first side or the second side of the second gate interconnect that connects together the set of eighth transistor fins at the eighth transistor drain, the twelfth interconnect being disconnected from the eleventh interconnect.

14. The device of claim 13, further comprising a second metal interconnect connecting together the sixth transistor drain, the eighth transistor drain, and the first gate interconnect, wherein the first, second, third, fourth, fifth, sixth, seventh, and eighth FinFETs operate together as a buffer with an input at the second gate interconnect and an output at the metal interconnect.

15. The device of claim 14, wherein the first, second, fifth, and sixth FinFETs are p-type metal oxide semiconductor (pMOS) transistors, and the third, fourth, seventh, and eighth FinFETs are n-type metal oxide semiconductor (nMOS) transistors.

16. The device of claim 14, wherein the first, second, fifth, and sixth FinFETs are n-type metal oxide semiconductor (nMOS) transistors, and the third, fourth, seventh, and eighth FinFETs are p-type metal oxide semiconductor (pMOS) transistors.

17. The device of claim 14, further comprising:
a first inverter having a first inverter input and a first inverter output, the first inverter output being connected to the input at the second gate interconnect; and
a second inverter having a second inverter input and a second inverter output, the metal interconnect being connected to the second inverter input,
wherein the first inverter, the second inverter, and the first, second, third, fourth, fifth, sixth, seventh, and eighth FinFETs operate together as a buffer with an input being the first inverter input and an output being the second inverter output.

18. A method of operation of a metal oxide semiconductor device, the device comprising a first fin field effect transistor (FinFET) having a first transistor source, a first transistor drain, a first transistor gate, and a set of first transistor fins, the device further comprising a second FinFET having a second transistor source, a second transistor drain, a second transistor gate, and a set of second transistor fins, the method comprising:
flowing a current from a first interconnect at the first transistor source to a second interconnect at the first transistor drain, the first interconnect connecting together the set of first transistor fins, the second interconnect connecting together the set of first transistor fins and the set of second transistor fins;
flowing the current from the first transistor drain to the second transistor source through the second interconnect;
flowing the current from the second interconnect at the second transistor source to a third interconnect at the second transistor drain, the third interconnect connecting together the set of second transistor fins, the third interconnect being disconnected from the first interconnect; and
isolating at least one of the first interconnect, the second interconnect, or the third interconnect from an adjacent FinFET by floating a gate interconnect or applying a source voltage to the gate interconnect, the gate interconnect extending adjacent at least one of the first interconnect, the second interconnect, or the third interconnect, the set of first transistor fins and the set of second transistor fins extending through the gate interconnect.

19. The method of claim 18, wherein the first transistor gate and the second transistor gate are formed of a same gate interconnect that extends linearly and parallel to the first, second, and third interconnects and orthogonal to the set of first transistor fins and the set of second transistor fins.

20. A metal oxide semiconductor device, the device comprising a first fin field effect transistor (FinFET) having a first transistor source, a first transistor drain, a first transistor gate, and a set of first transistor fins, the device further comprising a second FinFET having a second transistor source, a second transistor drain, a second transistor gate, and a set of second transistor fins, the device further comprising:
means for flowing a current from a first interconnect at the first transistor source to a second interconnect at the first transistor drain, the first interconnect connecting together the set of first transistor fins, the second interconnect connecting together the set of first transistor fins and the set of second transistor fins;
means for flowing the current from the first transistor drain to the second transistor source through the second interconnect;
means for flowing the current from the second interconnect at the second transistor source to a third interconnect at the second transistor drain, the third interconnect connecting together the set of second transistor fins, the third interconnect being disconnected from the first interconnect; and
means for isolating at least one of the first interconnect, the second interconnect, or the third interconnect from an adjacent FinFET by floating a gate interconnect or applying a source voltage to the gate interconnect, the gate interconnect extending adjacent at least one of the first interconnect, the second interconnect, or the third interconnect, the set of first transistor fins and the set of second transistor fins extending through the gate interconnect.

\* \* \* \* \*